United States Patent
Mueller et al.

(10) Patent No.: US 9,722,148 B2
(45) Date of Patent: Aug. 1, 2017

(54) LUMINESCENT CERAMIC FOR A LIGHT EMITTING DEVICE

(71) Applicant: LUMILEDS LLC, San Jose, CA (US)

(72) Inventors: Gerd O. Mueller, San Jose, CA (US); Regina B. Mueller-Mach, San Jose, CA (US); Michael R. Krames, Los Altos, CA (US); Peter J. Schmidt, Aachen (DE); Hans-Helmut Bechtel, Aachen (DE); Joerg Meyer, Aachen (DE); Jan de Graaf, Eindhoven (NL); Theo Arnold Kop, Eindhoven (NL)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 15/149,454

(22) Filed: May 9, 2016

(65) Prior Publication Data
US 2016/0254418 A1 Sep. 1, 2016

Related U.S. Application Data

(62) Division of application No. 12/034,588, filed on Feb. 20, 2008, now Pat. No. 9,359,260, which is a division
(Continued)

(51) Int. Cl.
*H01L 33/00* (2010.01)
*H01L 33/50* (2010.01)
(Continued)

(52) U.S. Cl.
CPC ............ *H01L 33/502* (2013.01); *C04B 35/44* (2013.01); *C04B 35/547* (2013.01);
(Continued)

(58) Field of Classification Search
CPC .. H01L 33/0079; H01L 33/32; H01L 33/0075
See application file for complete search history.

(56) References Cited

U.S. PATENT DOCUMENTS

| 3,103,607 A | 9/1963 | Rulon |
| 3,153,166 A | 10/1964 | Thornton et al. |

(Continued)

FOREIGN PATENT DOCUMENTS

| CN | 1111603 A | 11/1995 |
| DE | 10027199 | 1/2001 |

(Continued)

OTHER PUBLICATIONS

Decision of Rejection dated Apr. 24, 2014 for China Application No. 201110090653.X, 20 pages.
(Continued)

*Primary Examiner* — Ngan Ngo

(57) ABSTRACT

A semiconductor light emitting device comprising a light emitting layer disposed between an n-type region and a p-type region is combined with a ceramic layer which is disposed in a path of light emitted by the light emitting layer. The ceramic layer is composed of or includes a wavelength converting material such as a phosphor. Luminescent ceramic layers according to embodiments of the invention may be more robust and less sensitive to temperature than prior art phosphor layers. In addition, luminescent ceramics may exhibit less scattering and may therefore increase the conversion efficiency over prior art phosphor layers.

15 Claims, 4 Drawing Sheets

Related U.S. Application Data of application No. 10/861,172, filed on Jun. 3, 2004, now Pat. No. 7,361,938.

(51) Int. Cl.

| | | |
|---|---|---|
| *C04B 35/44* | (2006.01) | |
| *C04B 35/547* | (2006.01) | |
| *C04B 35/584* | (2006.01) | |
| *C04B 35/597* | (2006.01) | |
| *C04B 35/626* | (2006.01) | |
| *C04B 35/64* | (2006.01) | |
| *C04B 35/645* | (2006.01) | |
| *C09K 11/77* | (2006.01) | |
| *H01L 33/06* | (2010.01) | |
| *H01L 33/12* | (2010.01) | |
| *H01L 33/32* | (2010.01) | |
| *H01L 33/54* | (2010.01) | |
| *H01L 33/56* | (2010.01) | |
| *H01L 33/62* | (2010.01) | |
| *H01L 33/58* | (2010.01) | |
| *H01L 33/64* | (2010.01) | |

(52) U.S. Cl.
CPC .......... *C04B 35/584* (2013.01); *C04B 35/597* (2013.01); *C04B 35/6268* (2013.01); *C04B 35/64* (2013.01); *C04B 35/645* (2013.01); *C09K 11/7774* (2013.01); *H01L 33/007* (2013.01); *H01L 33/0075* (2013.01); *H01L 33/0079* (2013.01); *H01L 33/06* (2013.01); *H01L 33/12* (2013.01); *H01L 33/32* (2013.01); *H01L 33/501* (2013.01); *H01L 33/505* (2013.01); *H01L 33/508* (2013.01); *H01L 33/54* (2013.01); *H01L 33/56* (2013.01); *H01L 33/62* (2013.01); *H01L 33/641* (2013.01); *C04B 2235/3213* (2013.01); *C04B 2235/3217* (2013.01); *C04B 2235/3224* (2013.01); *C04B 2235/3225* (2013.01); *C04B 2235/3229* (2013.01); *C04B 2235/3286* (2013.01); *C04B 2235/6027* (2013.01); *C04B 2235/662* (2013.01); *H01L 33/58* (2013.01); *H01L 33/644* (2013.01); *H01L 2924/0002* (2013.01); *H01L 2933/005* (2013.01); *H01L 2933/0041* (2013.01); *H01L 2933/0066* (2013.01); *H01L 2933/0075* (2013.01)

(56) References Cited

U.S. PATENT DOCUMENTS

| | | |
|---|---|---|
| 3,932,881 A | 1/1976 | Mita et al. |
| 3,959,658 A | 5/1976 | Ziemer et al. |
| 5,676,891 A | 10/1997 | Boedinger |
| 5,744,815 A | 4/1998 | Gurevich et al. |
| 6,153,010 A * | 11/2000 | Kiyoku ................ B82Y 20/00 117/106 |
| 6,320,547 B1 | 11/2001 | Fathy et al. |
| 6,335,548 B1 | 1/2002 | Roberts et al. |
| 6,351,069 B1 | 2/2002 | Lowery et al. |
| 6,409,938 B1 | 6/2002 | Comanzo |
| 6,486,499 B1 | 11/2002 | Krames et al. |
| 6,501,100 B1 | 12/2002 | Srivastava et al. |
| 6,504,156 B1 | 1/2003 | Takahara |
| 6,576,488 B2 | 6/2003 | Collins, III et al. |
| 6,630,691 B1 | 10/2003 | Mueller-Mach et al. |
| 6,630,692 B2 | 10/2003 | Goetz et al. |
| 6,642,618 B2 | 11/2003 | Yagi et al. |
| 6,642,652 B2 | 11/2003 | Collins et al. |
| 6,650,044 B1 | 11/2003 | Lowery |
| 6,696,703 B2 | 2/2004 | Mueller-Mach et al. |
| 6,800,500 B2 | 10/2004 | Coman et al. |
| 6,828,596 B2 | 12/2004 | Steigerwald et al. |
| 6,876,008 B2 | 4/2005 | Bhat et al. |
| 6,878,973 B2 | 4/2005 | Lowery et al. |
| 6,956,246 B1 | 10/2005 | Epler et al. |
| 7,053,419 B1 | 5/2006 | Camras et al. |
| 7,064,355 B2 | 6/2006 | Camras et al. |
| 7,211,831 B2 | 5/2007 | Erchak |
| 7,250,715 B2 | 7/2007 | Mueller et al. |
| 7,361,938 B2 | 4/2008 | Mueller et al. |
| 7,554,258 B2 | 6/2009 | Rossner et al. |
| 2002/0001873 A1 | 1/2002 | Kang |
| 2002/0030444 A1 | 3/2002 | Mueller-Mach et al. |
| 2002/0175621 A1 | 11/2002 | Song et al. |
| 2002/0190641 A1 | 12/2002 | Sommers |
| 2003/0025449 A1 | 2/2003 | Rossner |
| 2003/0067264 A1 | 4/2003 | Takekuma |
| 2003/0141507 A1 | 7/2003 | Krames et al. |
| 2003/0189829 A1* | 10/2003 | Shimizu .................. F21L 4/00 362/240 |
| 2003/0214233 A1 | 11/2003 | Takahashi et al. |
| 2004/0007961 A1 | 1/2004 | Srivastava et al. |
| 2004/0012027 A1 | 1/2004 | Keller et al. |
| 2004/0027062 A1* | 2/2004 | Shiang ................ H01L 51/5262 313/506 |
| 2004/0041222 A1 | 3/2004 | Loh |
| 2004/0061433 A1* | 4/2004 | Izuno ................ H01L 21/76251 313/498 |
| 2004/0065886 A1 | 4/2004 | Eliashevich et al. |
| 2004/0124429 A1 | 7/2004 | Stokes et al. |
| 2004/0145289 A1 | 7/2004 | Ouderkirk et al. |
| 2004/0145308 A1* | 7/2004 | Rossner .................. C04B 35/44 313/512 |
| 2004/0164311 A1 | 8/2004 | Uemura |
| 2004/0170019 A1 | 9/2004 | Tamai |
| 2004/0179277 A1 | 9/2004 | Stallard et al. |
| 2005/0040413 A1* | 2/2005 | Takahashi ............ B82Y 20/00 257/96 |
| 2005/0194601 A1 | 9/2005 | Suenaga |
| 2005/0205883 A1 | 9/2005 | Wierer, Jr. et al. |
| 2005/0224826 A1 | 10/2005 | Keuper et al. |
| 2005/0269582 A1 | 12/2005 | Mueller et al. |
| 2006/0076883 A1* | 4/2006 | Himaki ................ C09K 11/0883 313/503 |
| 2006/0091409 A1 | 5/2006 | Epler et al. |
| 2006/0281203 A1 | 12/2006 | Epler et al. |
| 2007/0126017 A1* | 6/2007 | Krames .................. C04B 35/44 257/98 |
| 2009/0286342 A1* | 11/2009 | Takahashi ............ B82Y 20/00 438/32 |
| 2011/0156056 A1* | 6/2011 | Krames ................ H01L 33/0079 257/77 |

FOREIGN PATENT DOCUMENTS

| | | |
|---|---|---|
| DE | 10349038 A1 | 5/2004 |
| JP | 10041546 A | 2/1998 |
| JP | 10229218 A | 8/1998 |
| JP | 200031531 | 1/2000 |
| JP | 2000022222 A | 1/2000 |
| JP | 2001166717 A | 6/2001 |
| JP | 2002504058 A | 2/2002 |
| JP | 2003124503 A | 4/2003 |
| JP | 2003168726 A | 6/2003 |
| JP | 2004146835 | 5/2004 |
| WO | 02/089219 | 11/2002 |

OTHER PUBLICATIONS

Decision of Rejection dated Jun. 6, 2012 for Taiwan Application No. 094117905, 5 pages.

Decision on Rejection dated Apr. 3, 2009 for China Application No. 200580017783.3, 12 pages.

First Office Action dated May 3, 2012 for China Application No. 201110090653.X, 16 pages.

First Office Action dated Dec. 28, 2007 for China Application No. 200580017783.3, 21 pages.

(56) References Cited

OTHER PUBLICATIONS

Notice of Reexamination dated Jun. 29, 2015 for China Application No. 201110090653.X, 14 pages.
Office Action dated Mar. 8, 2011 for Japan Application No. 2007-514277, 6 pages.
Second Office Action dated Oct. 24, 2008 for China application No. 200580017783.3, 13 pages.
Office Action for Application No. TW094117905 dated Nov. 3, 2011.
Office Action for Application No. KR10-2007-7000010, dated Oct. 10, 2011.
Office Action for Application No. KR10-2007-7000010, dated May 29, 2012.
Office Action for Application No. JP2007-514277 dated Aug. 23, 2011.
Office Action for Application No. CN201110090653.X dated Feb. 16, 2013.
Office Action for Application No. CN201110090653.X dated Aug. 13, 2011.
Office Action for Application No. JP2011-279089 dated May 28, 2013.
Office Action for Application No. JP2011-279089 dated Nov. 26, 2013.
Extended European Search Report for Application No. EP14168580.0 dated Nov. 12, 2014.
International Search Report for Application No. PCT/IB2005/051702 dated Oct. 31, 2005.
Reexamination Decision dated Dec. 10, 2015 for China Application No. 201110090653.X, 25 pages.

\* cited by examiner

LUMINESCENT CERAMIC FOR A LIGHT EMITTING DEVICE

CROSS REFERENCE TO RELATED APPLICATIONS

This application is a division of U.S. patent application Ser. No. 12/034,588, filed Feb. 20, 2008, and titled "Luminescent Ceramic for a Light Emitting Device", which is a division of U.S. patent application Ser. No. 10/861,172, filed on Jun. 3, 2004, titled "Luminescent Ceramic for a Light Emitting Device", and issued as U.S. Pat. No. 7,361,938 on Apr. 22, 2008. Ser. Nos. 12/034,588 and 10/861,172 are incorporated herein.

BACKGROUND

Field of Invention

The present invention relates to wavelength converted semiconductor light emitting devices.

Description of Related Art

Light emitting diodes (LEDs) are well-known solid state devices that can generate light having a peak wavelength in a specific region of the light spectrum. LEDs are typically used as illuminators, indicators and displays. Traditionally, the most efficient LEDs emit light having a peak wavelength in the red region of the light spectrum, i.e., red light. However, III-nitride LEDs have been developed that can efficiently emit light having a peak wavelength in the UV to green region of the spectrum. III-nitride LEDs can provide significantly brighter output light than traditional LEDs.

In addition, since light from III-nitride devices generally has a shorter wavelength than red light, the light generated by the III-nitride LEDs can be readily converted to produce light having a longer wavelength. It is well known in the art that light having a first peak wavelength (the "primary light") can be converted into light having a longer peak wavelength (the "secondary light") using a process known as luminescence/fluorescence. The fluorescent process involves absorbing the primary light by a wavelength-converting material such as a phosphor, exciting the luminescent centers of the phosphor material, which emit the secondary light. The peak wavelength of the secondary light will depend on the phosphor material. The type of phosphor material can be chosen to yield secondary light having a particular peak wavelength.

With reference to FIG. 1, a prior art phosphor LED 10 described in U.S. Pat. No. 6,351,069 is shown. The LED 10 includes a III-nitride die 12 that generates blue primary light when activated. The III-nitride die 12 is positioned on a reflector cup lead frame 14 and is electrically coupled to leads 16 and 18. The leads 16 and 18 conduct electrical power to the III-nitride die 12. The III-nitride die 12 is covered by a layer 20, often a transparent resin, that includes wavelength-converting material 22. The type of wavelength-converting material utilized to form the layer 20 can vary, depending upon the desired spectral distribution of the secondary light that will be generated by the fluorescent material 22. The III-nitride die 12 and the fluorescent layer 20 are encapsulated by a lens 24. The lens 24 is typically made of a transparent epoxy or silicone.

In operation, electrical power is supplied to the III-nitride die 12 to activate the die. When activated, die 12 emits the primary light away from the top surface of the die. A portion of the emitted primary light is absorbed by the wavelength-converting material 22 in the layer 20. The wavelength-converting material 22 then emits secondary light, i.e., the converted light having a longer peak wavelength, in response to absorption of the primary light. The remaining unabsorbed portion of the emitted primary light is transmitted through the wavelength-converting layer, along with the secondary light. The lens 24 directs the unabsorbed primary light and the secondary light in a general direction indicated by arrow 26 as output light. Thus, the output light is a composite light that is composed of the primary light emitted from die 12 and the secondary light emitted from the wavelength-converting layer 20. The wavelength-converting material may also be configured such that very little or none of the primary light escapes the device, as in the case of a die that emits UV primary light combined with one or more wavelength-converting materials that emit visible secondary light.

As III-nitride LEDs are operated at higher power and higher temperature, the transparency of the organic encapsulants used in layer 20 tend to degrade, undesirably reducing the light extraction efficiency of the device and potentially undesirably altering the appearance of the light emitted from the device. Several alternative configurations of wavelength-converting materials have been proposed, such as growth of LED devices on single crystal luminescent substrates as described in U.S. Pat. No. 6,630,691, thin film phosphor layers as described in U.S. Pat. No. 6,696,703, and conformal layers deposited by electrophoretic deposition as described in U.S. Pat. No. 6,576,488 or stenciling as described in U.S. Pat. No. 6,650,044. However, one major disadvantage of prior solutions is the optical heterogeneity of the phosphor/encapsulant system, which leads to scattering, potentially causing losses in conversion efficiency.

SUMMARY

In accordance with embodiments of the invention, a semiconductor light emitting device comprising a light emitting layer disposed between an n-type region and a p-type region is combined with a ceramic layer which is disposed in a path of light emitted by the light emitting layer. The ceramic layer is composed of or includes a wavelength converting material such as a phosphor. Luminescent ceramic layers according to embodiments of the invention may be more robust and less sensitive to temperature than prior art phosphor layers. In addition, luminescent ceramics may exhibit less scattering and may therefore increase the conversion efficiency over prior art phosphor layers.

DETAILED DESCRIPTION

Figure 1:
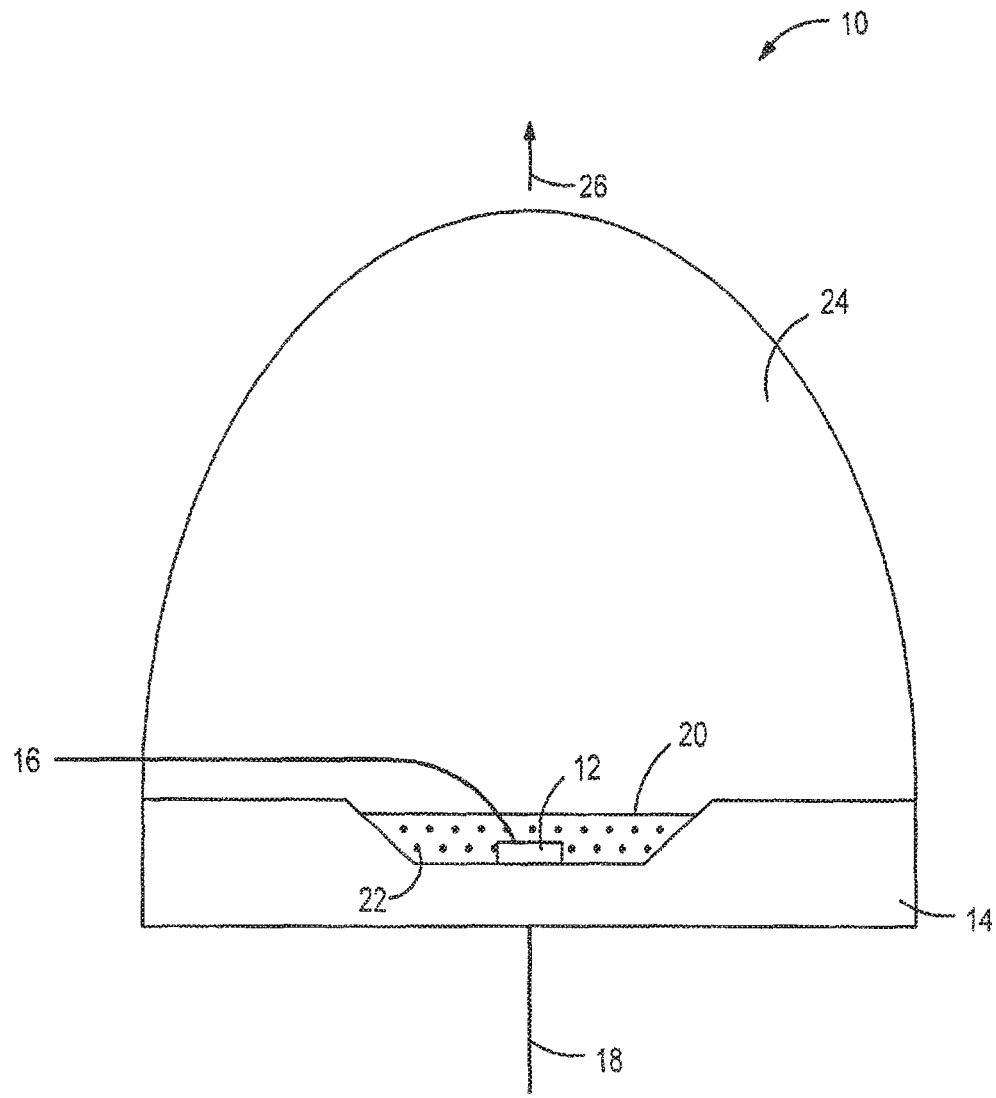
FIG. 1 illustrates a prior art phosphor-converted semiconductor light emitting device.

The above-mentioned devices with thin film or conformal phosphor layers can be difficult to handle because the phosphor layers tend to be fragile. In accordance with embodiments of the invention, wavelength converting materials such as phosphors are formed into ceramic slabs, referred to herein as "luminescent ceramics." The ceramic slabs are generally self-supporting layers formed separately from the semiconductor device, then attached to the finished semiconductor device or used as a growth substrate for the semiconductor device. The ceramic layers may be translucent or transparent, which may reduce the scattering loss associated with non-transparent wavelength converting layers such as conformal layers. Luminescent ceramic layers may be more robust than thin film or conformal phosphor layers. In addition, since luminescent ceramic layers are solid, it may be easier to make optical contact to additional optical elements such as lenses and secondary optics, which are also solid.

Examples of phosphors that may be formed into luminescent ceramic layers include aluminum garnet phosphors with the general formula $(Lu_{1-x-y-z-b}Y_xGd_y)_3(Al_{1-z}Ga_z)_{12}$:$Ce_aPr_b$ wherein $0<x<1$, $0<y<1$, $0<z\leq0.1$, $0<a\leq0.2$ and $0<b\leq0.1$, such as $Lu_3Al_5O_{12}$:$Ce^{3+}$ and $Y_3Al_5O_{12}$:$Ce^{3+}$ which emit light in the yellow-green range; and $(Sr_{1-x-y}Ba_xCa_y)_{2-z}Si_{5-a}Al_aN_{8-a}O_a$:$Eu_z^{2+}$ wherein $0\leq a<5$, $0<x\leq1$, $0\leq y\leq1$, and $0<z\leq1$ such as $Sr_2Si_5N_8$:$Eu^{2+}$, which emit light in the red range. Suitable $Y_3Al_5O_{12}$:$Ce^{3+}$ ceramic slabs may be purchased from Baikowski International Corporation of Charlotte, N.C. Other green, yellow, and red emitting phosphors may also be suitable, including $(Sr_{1-a-b}Ca_aBa_c)Si_xN_yOz$:$Eu_a^{2+}$ ($a=0.002$-$0.2$, $b=0.0$-$0.25$, $c=0.0$-$0.25$, $x=1.5$-$2.5$, $y=1.5$-$2.5$, $z=1.5$-$2.5$) including, for example, $SrSi_2N_2O_2$:$Eu^{2+}$; $(Sr_{1-u-v-x}Mg_uCa_vBa_x)(Ga_{2-y-z}Al_yIn_zS_4)$:$Eu^{2+}$ including, for example, $SrGa_2S_4$:$Eu^{2+}$; $Sr_{1-x}Ba_xSiO_4$:$Eu^{2+}$; and $(Ca_{1-x}Sr_x)S$:$Eu^{2+}$ wherein $0<x\leq1$ including, for example, $CaS$:$Eu^{2+}$ and $SrS$:$Eu^{2+}$.

A luminescent ceramic may be formed by heating a powder phosphor at high pressure until the surface of the phosphor particles begin to soften and melt. The partially melted particles stick together to form a rigid agglomerate of particles. Unlike a thin film, which optically behaves as a single, large phosphor particle with no optical discontinuities, a luminescent ceramic behaves as tightly packed individual phosphor particles, such that there are small optical discontinuities at the interface between different phosphor particles. Thus, luminescent ceramics are optically almost homogenous and have the same refractive index as the phosphor material forming the luminescent ceramic. Unlike a conformal phosphor layer or a phosphor layer disposed in a transparent material such as a resin, a luminescent ceramic generally requires no binder material (such as an organic resin or epoxy) other than the phosphor itself, such that there is very little space or material of a different refractive index between the individual phosphor particles. As a result, a luminescent ceramic is transparent or translucent, unlike a conformal phosphor layer.

Luminescent ceramic layers may be attached to light emitting devices by, for example, wafer bonding, sintering, gluing with thin layers of known organic adhesives such as epoxy or silicone, gluing with high index inorganic adhesives, and gluing with sol-gel glasses.

Examples of high index adhesives include high index optical glasses such Schott glass SF59, Schott glass LaSF 3, Schott glass LaSF N18, and mixtures thereof. These glasses often have an index of refraction greater than 1.8 and are available from Schott Glass Technologies Incorporated, of Duryea, Pa. Examples of other high index adhesives include high index chalcogenide glass, such as (Ge,Sb,Ga)(S,Se) chalcogenide glasses, III-V semiconductors including but not limited to GaP, InGaP, GaAs, and GaN, II-VI semiconductors including but not limited to ZnS, ZnSe, ZnTe, CdS, CdSe, and CdTe, group IV semiconductors and compounds including but not limited to Si and Ge, organic semiconductors, metal oxides including but not limited to tungsten oxide, titanium oxide, nickel oxide, zirconium oxide, indium tin oxide, and chromium oxide, metal fluorides including but not limited to magnesium fluoride and calcium fluoride, metals including but not limited to Zn, In, Mg, and Sn, yttrium aluminum garnet (YAG), phosphide compounds, arsenide compounds, antimonide compounds, nitride compounds, high index organic compounds, and mixtures or alloys thereof. Gluing with high index inorganic adhesives is described in more detail in application Ser. No. 09/660,317, filed Sep. 12, 2000, and Ser. No. 09/880,204, filed Jun. 12, 2001, both of which are incorporated herein by reference.

Gluing with sol-gel glasses is described in more detail in U.S. Pat. No. 6,642,618, which is incorporated herein by reference. In embodiments where the luminescent ceramic is attached to the device by a sol-gel glass, one or more materials such as oxides of titanium, cerium, lead, gallium, bismuth, cadmium, zinc, barium, or aluminum may be included in the $SiO_2$ sol-gel glass to increase the index of refraction of the glass in order to more closely match the index of the glass with the indices of the luminescent ceramic and the light emitting device. For example, a $Y_3Al_5O_{12}$:$Ce^{3+}$ ceramic layer may have an index of refraction of between about 1.75 and 1.8, and may be attached to a sapphire growth substrate of a semiconductor light emitting device, which sapphire substrate has an index of refraction of about 1.8. It is desirable to match the refractive index of the adhesive to the refractive indices of the $Y_3Al_5O_{12}$:$Ce^{3+}$ ceramic layer and the sapphire growth substrate.

In some embodiments, a luminescent ceramic serves as a growth substrate for the semiconductor light emitting device. This is especially plausible with III-nitride light emitting layers such as InGaN, which are able to be grown on a lattice-mismatched substrate (e.g., sapphire or SiC), resulting in high dislocation densities, but still exhibit high external quantum efficiency in LEDs. Thus, a semiconductor light emitting device may be grown on a luminescent ceramic in a similar manner. For example, using metal-organic chemical vapor-phase epitaxy or another epitaxial technique, a III-nitride nucleation layer is deposited, typically at low temperature (~550° C.), directly on the luminescent ceramic substrate. Then, a thicker layer of GaN ('buffer' layer) is deposited, typically at higher temperature, on the III-nitride nucleation layer and coalesced into a single crystal film. Increasing the thickness of the buffer layer can reduce the total dislocation density and improve the layer quality. Finally, n-type and p-type layers are deposited, between which light emitting III-nitride active layers are included. The ability to withstand the III-nitride growth environment (e.g., temperatures greater than 1,000° C. and an $NH_3$ environment) will govern the choice of luminescent ceramic as a growth substrate. Because the ceramics are poly-crystalline, and the resulting III-nitride layers should be single crystal, special additional growth considerations may apply. For example, for the situation described above, it may be necessary to insert multiple low-temperature interlayers within the GaN buffer layer to 'reset' the GaN growth and avoid ceramic grain orientation effects from propagating into the III-nitride device layers. These and other techniques are known in the art for growing on lattice-mismatched substrates. Suitable growth techniques are described in, for example, U.S. Pat. No. 6,630,692 to Goetz et al., which is assigned to the assignee of the present application and incorporated herein by reference.

Though the examples below refer to III-nitride light emitting diodes, it is to be understood that embodiments of the invention may extend to other light emitting devices, including devices of other materials systems such as III-phosphide and III-arsenide, and other structures such as resonant cavity LEDs, laser diodes, and vertical cavity surface emitting lasers.

Figure 2:
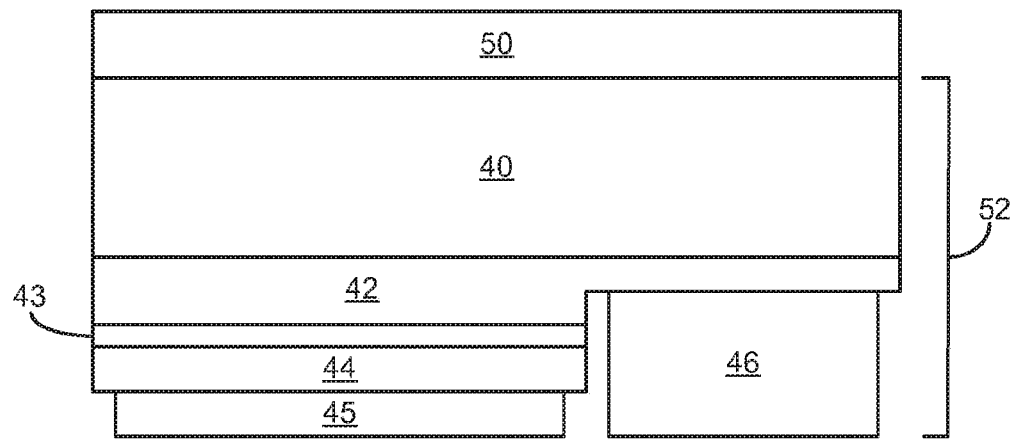
FIG. 2 illustrates a flip chip semiconductor light emitting device including a ceramic phosphor layer.
Figure 3:
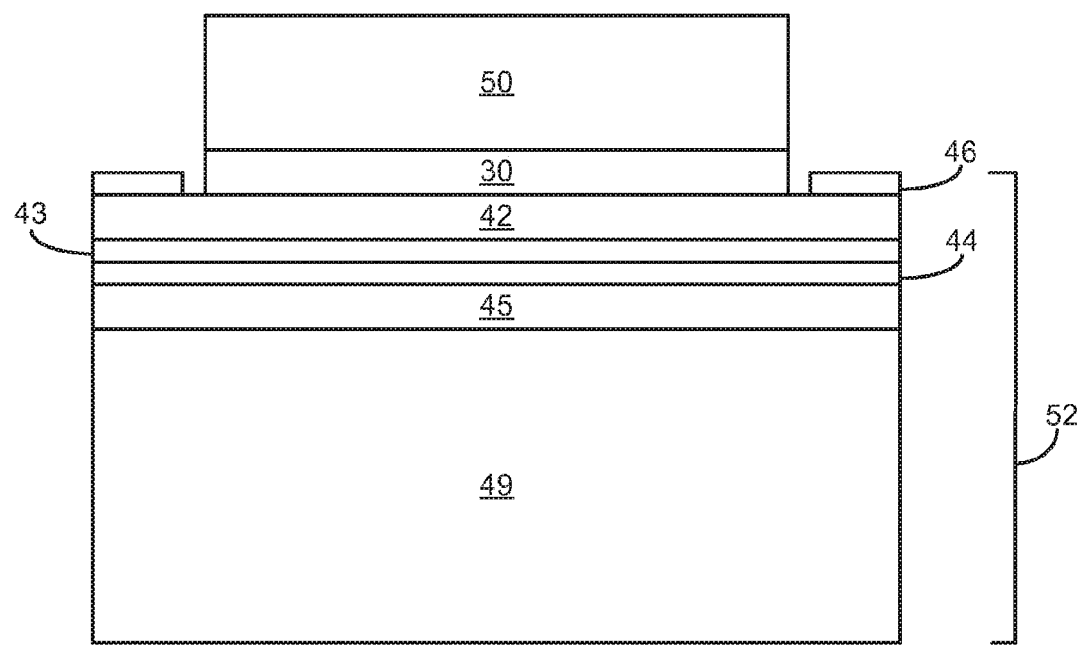
FIG. 3 illustrates a semiconductor light emitting device including a bonded host substrate and a ceramic phosphor layer.

FIGS. 2 and 3 illustrate III-nitride devices including luminescent ceramic layers. In the device of FIG. 2, an n-type region 42 is grown over a suitable growth substrate 40, followed by active region 43 and p-type region 44. Growth substrate 40 may be, for example, sapphire, SiC, GaN, or any other suitable growth substrate. Each of n-type region 42, active region 43, and p-type region 44 may include multiple layers of different composition, thickness, and dopant concentration. For example, n-type region 42 and p-type region 44 may include contact layers optimized for ohmic contact and cladding layers optimized to contain carriers within active region 43. Active region 43 may include a single light emitting layer, or may include multiple quantum well light emitting layers separated by barrier layers.

In the device illustrated in FIG. 2, a portion of p-type region 44 and active region 43 are etched away to reveal a portion of n-type region 42. A p-contact 45 is formed on the remaining portion of p-type region 44 and an n-contact 46 is formed on the exposed portion of n-contact 46. In the embodiment illustrated in FIG. 2, contacts 45 and 46 are reflective such that light is extracted from the device through the back side of substrate 40. Alternatively, contacts 45 and 46 may be transparent or formed in such a way that a large portion of the surfaces of p-type region 44 and n-type region 42 are left uncovered by contacts. In such devices, light may be extracted from the device through the top surface of the epitaxial structure, the surface on which contacts 45 and 46 are formed.

In the device illustrated in FIG. 3, the epitaxial layers are bonded to a host substrate 49 through p-contact 45. Additional layers to facilitate bonding (not shown) may be included between p-type region 44 and host 49. After the epitaxial layers are bonded to host 49, the growth substrate may be removed to expose a surface of n-type region 42. Contact to the p-side of the active region is provided through host 49. An n-contact 46 is formed on a portion of the exposed surface of n-type region 42. Light is extracted from the device through the top surface of n-type region 42. Growth substrate removal is described in more detail in application Ser. No. 10/804,810, filed Mar. 19, 2004, titled "Photonic Crystal Light Emitting Device," assigned to the assignee of the present invention, and incorporated herein by reference.

In the devices illustrated in FIGS. 2 and 3, a luminescent ceramic layer 50 such as the ceramic layers described above, is attached to the surface of the device from which light is extracted; the back of substrate 40 in FIG. 2 and the top of n-type region 42 in FIG. 3. Ceramic layer 50 may be formed on or attached to any surface from which light is extracted from the device. For example, ceramic layer 50 may extend over the sides of the device illustrated in FIG. 2. FIG. 3 illustrates an optional filter 30, which allows light from active region 43 to pass into ceramic layer 50, but reflects light emitted by ceramic layer 50, such that light emitted by ceramic layer 50 is inhibited from entering device 52, where it is likely to be absorbed and lost. Examples of suitable filters include dichroic filters available from Unaxis Balzers Ltd. of Liechtenstein or Optical Coating Laboratory, Inc. of Santa Rosa, Calif.

Figure 4:
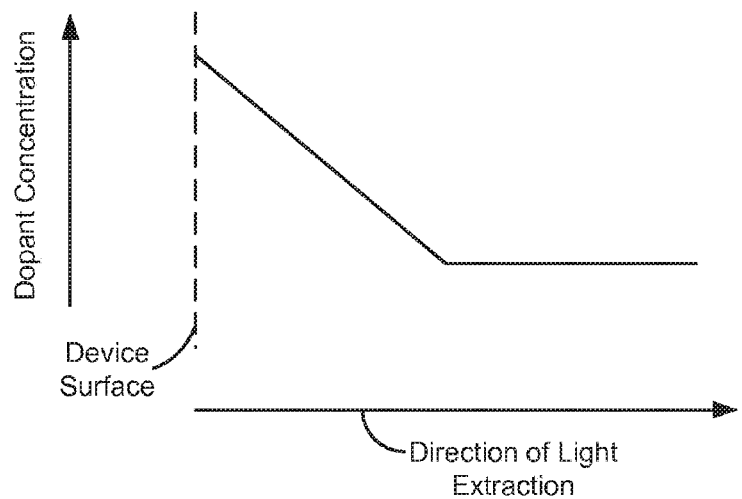
FIG. 4 illustrates an example of a doping profile in a ceramic phosphor layer.

Luminescent ceramic layer 50 may include a single phosphor or multiple phosphors mixed together. In some embodiments, the amount of activating dopant in the ceramic layer is graded. FIG. 4 illustrates an example of a graded doping profile in a luminescent ceramic layer. The dashed line in FIG. 4 represents the surface of the device. The phosphor in the portion of the ceramic layer closest to the device surface has the highest dopant concentration. As the distance from the device surface increases, the dopant concentration in the phosphor decreases. Though a linear dopant profile with a region of constant dopant concentration is shown in FIG. 4, it is to be understood that the grading profile may take any shape including, for example, a step-graded profile or a power law profile, and may include multiple or no regions of constant dopant concentration. In addition, in some embodiments it may be advantageous to reverse the grading profile, such that the region closest to the device surface has a small dopant concentration that increases as the distance from the device surface increases. In some embodiments, the portion of the ceramic layer furthest from the device surface may not contain any phosphor or any dopant, and may be shaped (as shown below) for light extraction.

Figure 5:
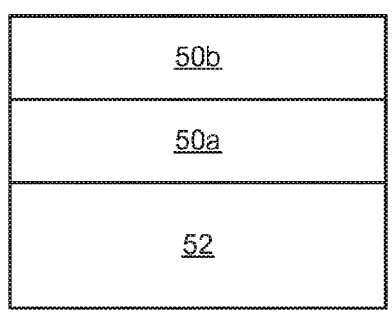
FIG. 5 illustrates a semiconductor light emitting device including multiple ceramic layers.

In some embodiments, devices include multiple ceramic layers, as in the device illustrated in FIG. 5. Ceramic layer 50a is attached to device 52, which may be, for example, either of the devices illustrated in FIGS. 2 and 3. Ceramic layer 50b is attached to ceramic layer 50a. In some embodiments, one of the two ceramic layers 50a and 50b contains all the wavelength converting materials used in the device, and the other of the two ceramic layers is transparent and used as a spacer layer, if it is the ceramic layer adjacent to device 52, or as a light extraction layer, if it is the ceramic layer furthest from device 52. In some embodiments, each of ceramic layers 50a and 50b may contain a different phosphor or phosphors. Though two ceramic layers are illustrated in FIG. 5, it is to be understood that devices including more than two ceramic layers and/or more than two phosphors are within the scope of the invention. The arrangement of the different phosphors in ceramic layers 50a and 50b or ceramic layers 50a and 50b themselves may chosen to control the interaction between the multiple phosphors in a device, as described in application Ser. No. 10/785,616 filed Feb. 23, 2004 and incorporated herein by reference. Though ceramic layers 50a and 50b are shown stacked over device 52 in FIG. 5, other arrangements are possible and within the scope of the invention. In some embodiments, a device including one or more ceramic layers may be combined with other wavelength converting layers, such as the wavelength converting material shown in FIG. 1, or the thin films, conformal layers, and luminescent substrates described in the background section. Transparent ceramic layers that are not luminescent may be, for example, the same host material as the luminescent ceramic layer, without the activating dopant.

Figure 6:
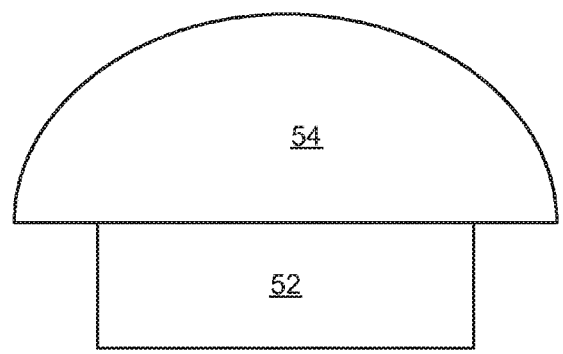
FIG. 6 illustrates a semiconductor light emitting device including a shaped ceramic phosphor layer.
Figure 7:
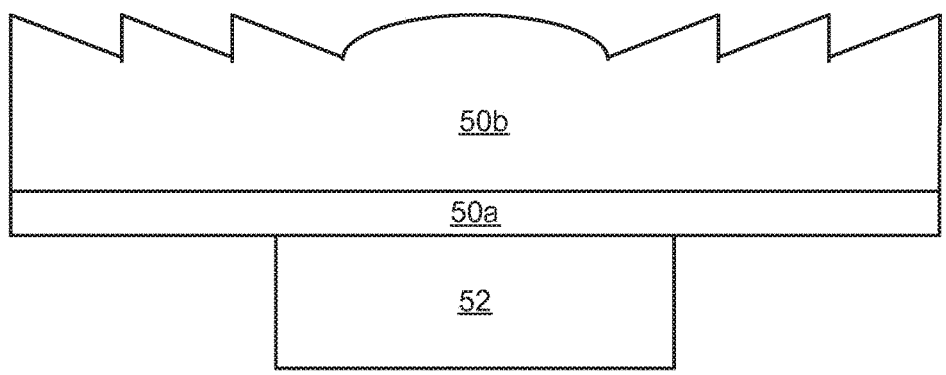
FIG. 7 illustrates a semiconductor light emitting device including a ceramic phosphor layer wider than the epitaxial layers in the device.

An advantage of luminescent ceramic layers is the ability to mold, grind, machine, hot stamp or polish the ceramic layers into shapes that are desirable, for example, for increased light extraction. Luminescent ceramic layers generally have high refractive indices, for example 1.75 to 1.8 for a $Y_3Al_5O_{12}:Ce^{3+}$ ceramic layer. In order to avoid total internal reflection at the interface between the high index ceramic layer and low index air, the ceramic layer may be shaped as illustrated in FIGS. 6 and 7. In the device illustrated in FIG. 6, the luminescent ceramic layer 54 is shaped into a lens such as a dome lens. Light extraction from the device may be further improved by texturing the top of the ceramic layer, either randomly or in, for example, a Fresnel lens shape, as illustrated in FIG. 7. In some embodiments the top of the ceramic layer may be textured with a photonic crystal structure, such as a periodic lattice of holes formed in the ceramic. The shaped ceramic layer may be smaller than or the same size as face of device 52 to which it is attached or it may be larger than the face of device 52 to which it is attached, as illustrated in FIGS. 6 and 7. In devices such as FIG. 7, favorable light extraction is expected for shaped ceramic layers having a bottom length at least twice the length of the face of device 52 on which the ceramic layer is mounted. In some embodiments, the wavelength converting material is confined to the portion of the ceramic layer closest to the device 52. In other embodiments, as illustrated in FIG. 7, the wavelength converting material is provided in a first ceramic layer 50*a*, then attached to a second, shaped, transparent ceramic layer 50*b*.

In some embodiments, the surface of the top ceramic layer is roughened to increase scattering necessary to mix the light, for example, in a device where light from the light emitting device and one or more wavelength converting layers mixes to form white light. In other embodiments, sufficient mixing may be accomplished by secondary optics such as a lens or light guide, as is known in the art.

Figure 8:
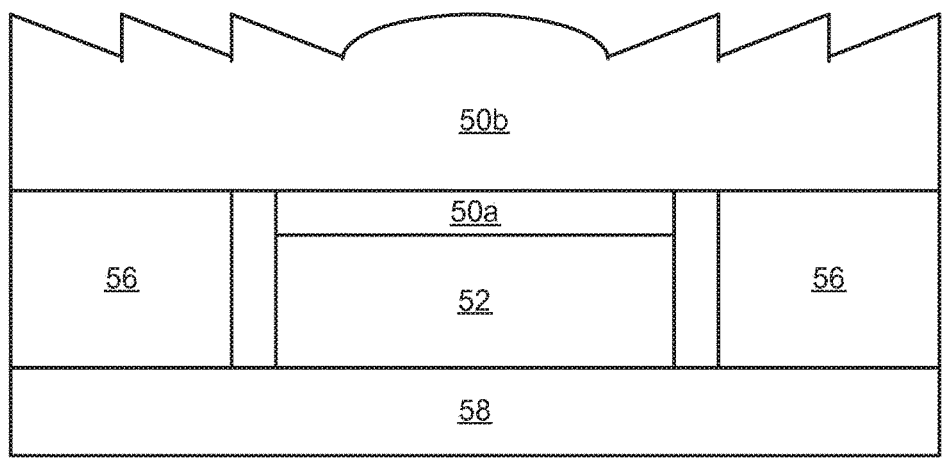
FIG. 8 illustrates a semiconductor light emitting device including a ceramic phosphor layer and a heat extraction structure.

A further advantage of luminescent ceramic layers is the favorable thermal properties of ceramics. A device including a luminescent ceramic layer and a heat extraction structure is illustrated in FIG. 8. As in FIG. 7, FIG. 8 includes a transparent or luminescent ceramic layer 50*b* that is shaped for light extraction. An optional additional transparent or luminescent ceramic layer 50*a* is disposed between layer 50*b* and device 52. Device 52 is mounted on a submount 58, for example as a flip chip as illustrated in FIG. 2. Submount 58 and host substrate 49 of FIG. 3, may be, for example, metals such as Cu foil, Mo, Cu/Mo, and Cu/W; semiconductors with metal contacts, such as Si with ohmic contacts and GaAs with ohmic contacts including, for example, one or more of Pd, Ge, Ti, Au, Ni, Ag; and ceramics such as compressed diamond. Layers 56 are thermally conductive materials that connect ceramic layer 50*b* to submount 58, potentially reducing the temperature of luminescent ceramic layer 50*a* and/or 50*b*, and thereby increasing light output. Material suitable for layers 56 include the submount material described above. The arrangement illustrated in FIG. 8 is particularly useful to extract heat from flip chip devices with conductive substrates, such as SiC.

EXAMPLE

An example of a cerium-doped yttrium aluminum garnet ceramic slab diffusion-bonded to a sapphire substrate is given below.

Diffusion-bonded YAG-sapphire composites are advantageous because of their high mechanical strength and excellent optical quality. According to the phase diagram yttria-alumina within the composition range $Al_2O_3$ and 3 $Y_2O_3$ 5 $Al_2O_3$, no other phase exists except an eutecticum with 33% Al. Therefore, a sinterbonded YAG-sapphire composite has an average refractive index at the (eutectoidic) interface between YAG ceramic ($n_i$=1.84) and sapphire substrate ($n_i$=1.76) and thus a high quality optical contact can be obtained. In addition, because of the similar expansion coefficients of YAG and sapphire (YAG: $6.9 \times 10^{-6}$ $K^{-1}$, $Al_2O_3$: $8.6 \times 10^{-6}$ $K^{-1}$), sinterbonded wafers with low mechanical stress can be produced.

A diffusion-bonded YAG:Ce ceramic-sapphire wafer may be formed as follows:

a) Production of YAG:Ce ceramic: 40 g $Y_2O_3$ (99.998%), 32 g $Al_2O_3$ (99.999%), and 3.44 g $CeO_2$ are milled with 1.5 kg high purity alumina balls (2 mm diameter) in isopropanol on a roller bench for 12 hrs. The dried precursor powder is then calcined at 1300° C. for two hours under CO atmosphere. The YAG powder obtained is then deagglomerated with a planet ball mill (agate balls) under ethanol. The ceramic slurry is then slip casted to obtain a ceramic green body after drying. The green bodies are then sintered between graphite plates at 1700° C. for two hours.

b) Diffusion-bonding of a sapphire wafer and a YAG:Ce ceramic: The ground and polished sapphire and YAG wafers are diffusion bonded in a uniaxial hot pressing apparatus (HUP). For this purpose, sapphire and YAG wafers are stacked between tungsten foils (0.5 mm thickness) and placed in a graphite pressing die. To increase the speed of processing several sapphire/YAG:Ce ceramic/tungsten foil stacks can be stacked and processed simultaneously.

After evacuation of the HUP apparatus the temperature is first increased to 1700° C. within 4 hrs without applying external pressure. Then a uniaxial pressure of 300 bar is applied and kept constant for 2 hrs. After the dwell time the temperature is lowered to 1300° C. within 2 hrs by keeping the pressure constant. Finally, the system is cooled down to room temperature within 6 hrs after releasing the pressure.

c) Post processing of sinterbonded sapphire-YAG:Ce wafers: After grinding and polishing of the surfaces of the sinterbonded wafers, the samples are annealed for 2 hrs at 1300° C. in air (heating rate: 300 K/hr), then cooled down to room temperature within 12 hrs.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is being claimed is:

1. A method comprising:
    providing a light emitting device including a semiconductor structure comprising III-nitride light emitting layer disposed between an n-type region and a p-type region;
    mounting the light emitting device on a mount; and
    connecting a ceramic layer comprising a wavelength converting material to a surface of the light emitting device from which light is extracted.

2. The method of claim 1 wherein providing a light emitting device comprises providing a semiconductor structure grown on a growth substrate, the method further comprising removing the growth substrate from the semiconductor structure after mounting the light emitting device on a mount.

3. The method of claim 1 wherein mounting comprises mounting the light emitting device in a flip chip configuration.

4. The method of claim 1 wherein the mount has a lateral extent greater than the light emitting device.

5. The method of claim 1 wherein connecting comprises connecting the ceramic layer to a surface of a growth substrate.

6. The method of claim 1 wherein connecting comprises connecting the ceramic layer to a surface of a III-nitride layer.

7. The method of claim 1 wherein connecting comprises wafer bonding.

8. The method of claim 1 wherein connecting comprises sintering.

9. The method of claim 1 wherein connecting comprises gluing with silicone.

10. The method of claim 1 wherein connecting comprises diffusion bonding in a uniaxial hot pressing apparatus.

11. The method of claim 1 wherein connecting comprises heating the light emitting device and the ceramic layer.

12. The method of claim 1 wherein connecting comprises applying external pressure to the light emitting device and the ceramic layer.

13. The method of claim 1 wherein connecting comprises growing the semiconductor structure over the ceramic layer.

14. The method of claim 1 wherein the mount comprises one of ceramic and metal.

15. The method of claim 1 further comprising providing a thermally conductive material connecting the ceramic layer and the mount.

* * * * *